United States Patent
Kawaguchi et al.

(10) Patent No.: US 12,092,669 B2
(45) Date of Patent: Sep. 17, 2024

(54) AD CONVERTER, POWER MEASUREMENT DEVICE FOR WIDEBAND NOISE USING SAME, AND POWER SPECTRUM MEASUREMENT DEVICE

(71) Applicant: ELECS INDUSTRY CO., LTD., Kawasaki (JP)

(72) Inventors: Noriyuki Kawaguchi, Chofu (JP); Takashi Maeda, Chofu (JP); Kenichi Harada, Kawasaki (JP); Kenji Ema, Kawasaki (JP); Kensuke Ozeki, Kawasaki (JP)

(73) Assignee: ELECS INDUSTRY CO., LTD., Kanagawa (JP)

( * ) Notice: Subject to any disclaimer, the term of this patent is extended or adjusted under 35 U.S.C. 154(b) by 0 days.

(21) Appl. No.: 18/560,972

(22) PCT Filed: Mar. 29, 2022

(86) PCT No.: PCT/JP2022/015594
§ 371 (c)(1),
(2) Date: Nov. 15, 2023

(87) PCT Pub. No.: WO2022/249747
PCT Pub. Date: Dec. 1, 2022

(65) Prior Publication Data
US 2024/0255555 A1    Aug. 1, 2024

(30) Foreign Application Priority Data

May 24, 2021    (JP) .................................. 2021-086707

(51) Int. Cl.
*G01R 21/133*    (2006.01)

(52) U.S. Cl.
CPC ................................ *G01R 21/133* (2013.01)

(58) Field of Classification Search
CPC .......... G01R 21/133; H03M 1/50; H03M 1/12
(Continued)

(56) References Cited

U.S. PATENT DOCUMENTS

| 5,459,319 | A | 10/1995 | Norsworthy |
| 11,784,559 | B2 * | 10/2023 | Leroy ....................... H02J 1/14 323/282 |

(Continued)

FOREIGN PATENT DOCUMENTS

| JP | 3-20615 A | 1/1991 |
| JP | 3-75576 A | 3/1991 |

(Continued)

OTHER PUBLICATIONS

International Search Report dated Jun. 21, 2022, issued in counterpart International Application No. PCT/JP2022/015594. (2 pages).

(Continued)

*Primary Examiner* — Giovanni Astacio-Oquendo
(74) *Attorney, Agent, or Firm* — WHDA, LLP

(57) ABSTRACT

Provided is an AD converter that is capable of converting a wideband noise signal of several GHz or more into a digital signal and that can be used even when an installation space and power supply are severely limited. The AD converter includes: a comparator (10) configured to compare an input voltage of an analog signal to a determination voltage; an adjustment unit (12) configured to shift at least one of the input voltage of the analog signal or the determination voltage; an encoder (11) configured to output time-series data of one bit based on a result of the comparison obtained by the comparator; a processing unit (13) configured to calculate a frequency of appearance of an output code included in the time-series data; and a control unit (14) configured to cause the adjustment unit to operate so that a (Continued)

result of the calculation obtained by the processing unit becomes a predetermined value.

5 Claims, 3 Drawing Sheets

(58) Field of Classification Search
    USPC .............................. 324/76.19, 76.12, 76.11
    See application file for complete search history.

(56) References Cited

U.S. PATENT DOCUMENTS

| 2005/0270202 A1* | 12/2005 | Haartsen | ................ | H03M 1/04 |
| | | | | 341/143 |
| 2024/0094270 A1* | 3/2024 | Cao | ........................ | G01R 31/40 |

FOREIGN PATENT DOCUMENTS

| JP | 4-42061 A | 2/1992 |
| JP | 8-116257 A | 5/1996 |
| JP | 2007-318457 A | 12/2007 |
| JP | 2013-190655 A | 9/2013 |

OTHER PUBLICATIONS

Notification of Reasons for Refusal dated Feb. 15, 2022, issued in counterpart of Japanese Patent Application No. 2021-086707, with English Translation. (10 pages).

Decision to Grant a Patent dated Apr. 19, 2022, issued in counterpart of Japanese Patent Application No. 2021-086707, with English Translation. (6 pages).

* cited by examiner

AD CONVERTER, POWER MEASUREMENT DEVICE FOR WIDEBAND NOISE USING SAME, AND POWER SPECTRUM MEASUREMENT DEVICE

TECHNICAL FIELD

The present invention relates to an AD converter for converting an analog signal into a digital signal, and relates to an AD converter that can be used for power measurement and power spectrum measurement of a noise signal having a wide bandwidth, such as an electromagnetic wave emitted from nature.

BACKGROUND ART

In radio-astronomical observation, earth observation, atmospheric observation, and the like, remote sensing is widely used. In the remote sensing, electromagnetic waves emitted from nature are measured, and scientific knowledge about an object to be measured is obtained based on results of the measurement to obtain useful information on the global environment, resource exploration, weather prediction, and the like.

Unlike artificially generated communication waves, the electromagnetic waves emitted from nature are characterized as weak noise signals having a wide bandwidth of several GHz to several tens of GHz, and a radio telescope and a microwave radiometer are used as measuring instruments for receiving such noise signals.

In the radio telescope and the microwave radiometer, in order to correctly measure the strength of a noise signal received by an antenna, it is required to measure the sum of power over the entire received bandwidth, and it is also required to set the bandwidth for measurement to be wide in order to improve the sensitivity of the measurement.

Meanwhile, as a power measurement method for an AC electrical signal such as a noise signal, a digital power measurement method has been adopted (e.g., Digital Power Meter WT300E, manufactured by Yokogawa Electric Corporation). In this digital method, an input analog signal is converted into a digital signal by an AD converter, waveform data obtained by the conversion is digitally processed to perform square-law detection, and a signal wave thus obtained is integrated to measure the power of an AC electric signal.

When an analog signal is converted into a digital signal by the AD converter and the power of a wideband noise signal is measured from the resultant digital signal, the AD converter is required to have a sampling frequency that is at least twice or more the bandwidth of the noise signal. For example, when radiated power of water vapor having a center frequency near 22 GHz is to be measured with a bandwidth of 8 GHz, a frequency band of 16 GHz to 24 GHz is required to be measured, and the AD converter requires a sampling frequency of 16 GHz or higher. In addition, in order to obtain power values by square-law detection as described above, amplitude information of a noise waveform is required, and hence sampling is required to be performed with a resolution corresponding to a measurement accuracy.

As a type of an AD converter that can set a high sampling frequency, a flash AD converter as disclosed in, for example, each of Patent Literature 1 and Patent Literature 2 is known. When the resolution of this flash AD converter is N bits, a reference voltage divided into (2N-1) in advance and an analog signal are simultaneously compared to each other by a comparator, and results of the comparison are converted into digital signals by an encoder.

CITATION LIST

Patent Literature

[PTL 1] JP 08-116257 A
[PTL 2] JP 2007-318457 A

SUMMARY OF INVENTION

Technical Problem

However, the flash AD converter requires a large number of comparators corresponding to the required resolution, and hence its circuit size and power consumption tend to be increased. For this reason, the capabilities as an AD converter, that is, the sampling frequency and the resolution, are limited by the integration scale and power consumption of the circuit, and it is difficult to achieve both a high sampling frequency and a high resolution. For example, an AD converter that can perform sampling at a high frequency such as 16 GHz has a low resolution of 3 bits. Conversely, an AD converter having a high resolution of 12 bits has a low sampling frequency of 4 GHz, and hence the bandwidth of noise signals that can be measured is limited to 2 GHz. Therefore, even when an AD converter having a higher sampling frequency and more bits is developed in the future, such an AD converter is expected to be large in size and have high power consumption.

The above-mentioned measurement devices, such as the radio telescope and the microwave radiometer, are mainly mounted on a spacecraft such as an artificial satellite for the purposes of astronomical observation and earth observation. However, it is difficult to mount a large-sized and power-consuming device on a spacecraft because of its strict limitations on space for mounting and allowable power consumption. In addition, even for a measurement device to be used on the ground, under an environment in which it is difficult to provide a stable and continuous power supply and battery-powered operation is required, it is difficult to use a measurement device having high power consumption, as is the case with a spacecraft.

Solution to Problem

The present invention has been made in view of the above-mentioned problems, and has an object to provide an AD converter that is capable of converting a wideband noise signal of several GHz or more into a digital signal and that can be used even when an installation space and power supply are severely limited.

That is, according to one embodiment of the present invention, there is provided an AD converter for converting an analog signal into a digital signal, the AD converter including: a comparator configured to compare an input voltage of the analog signal to a determination voltage; an adjustment unit configured to shift at least one of the input voltage of the analog signal or the determination voltage; an encoder configured to output time-series data of one bit based on a result of the comparison obtained by the comparator; a processing unit configured to calculate a frequency of appearance of an output code included in the time-series data; and a control unit configured to cause the adjustment unit to operate so that a result of the calculation obtained by the processing unit becomes a predetermined value.

Advantageous Effects of Invention

According to the AD converter of the present invention, when at least one of the input voltage of the analog signal or the determination voltage to be input to the comparator is freely shifted, a ratio of appearance of a code "1" or "0" of the one-bit digital signal output from the comparator is different depending on a shift amount of the input voltage of the analog signal or the determination voltage. Accordingly, by calculating the frequency of appearance of the code "1" or "0" of the digital signal within a predetermined time in the processing unit and changing the shift amount based on a result of the calculation, it is possible to acquire various types of information on the waveform of the input analog signal.

For example, when the determination voltage is changed so that the frequency of appearance of the code "1" or "0" within the predetermined time becomes 50%, the determination voltage indicates an average voltage of the input analog signal. Further, when the determination voltage is changed so that the ratio of appearance of the code "0" within the predetermined time becomes 100%, the determination voltage indicates a maximum voltage of the input analog signal. Even when the determination voltage is fixed and the average voltage of the input analog signal is shifted, it is possible to know a minimum voltage of the input analog signal and the maximum voltage thereof in a similar manner.

As described above, the AD converter of the present invention converts the analog signal into the digital signal with a single comparator, and can acquire various types of information on the waveform of the input analog signal, in particular, various types of information on the waveform of an unknown noise signal emitted from nature and deep space, from the frequency of appearance of the code of the one-bit digital signal. Therefore, the AD converter can convert a wideband noise signal of several GHz or more into a digital signal on a small scale and with low power consumption, and can be used for various measurement devices with significant limitations in its installation space and power supply, such as a power measurement device for a wideband noise signal and a power spectrum measurement device therefor.

DESCRIPTION OF EMBODIMENTS

Now, referring to the accompanying drawings, an AD converter to which the present invention is applied and a power measurement device for wideband noise and a power spectrum measurement device therefor which use the AD converter are described in detail.

Figure 1:
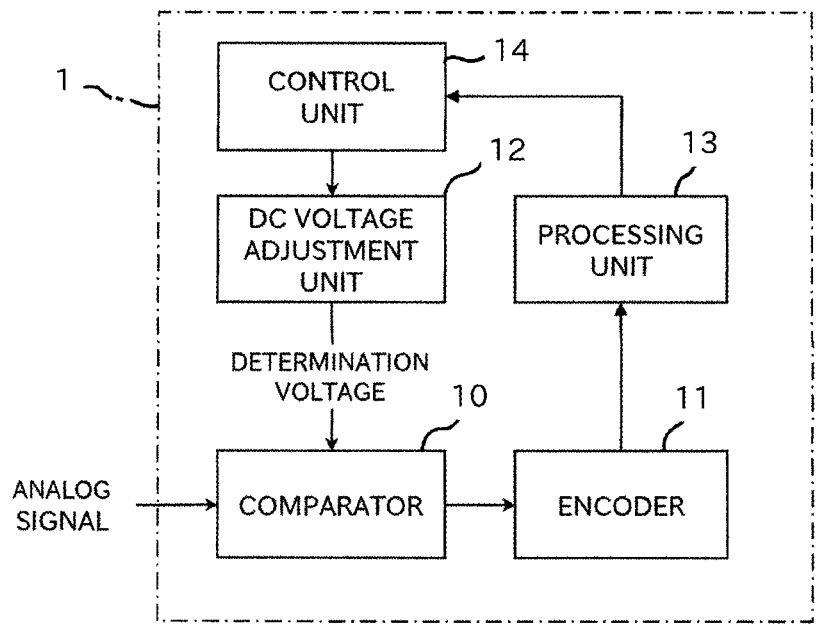
FIG. 1 is a block diagram for illustrating an example of a configuration of an AD converter to which the present invention is applied.

FIG. 1 is a block diagram for illustrating an example of a configuration of the AD converter to which the present invention is applied. An AD converter 1 includes a single comparator 10 which compares an input voltage of an analog signal to a determination voltage to quantize the analog signal, and uses an encoder 11 to encode an amplitude value cut out by a discrete period by the comparator 10 into a one-bit digital signal, that is, "1" or "0", for output.

The determination voltage is input from a DC voltage adjustment unit 12 to the comparator 10, and the magnitude of the determination voltage can be freely set between a maximum allowable input voltage and a minimum allowable input voltage of the AD converter 1. The DC voltage adjustment unit corresponds to an adjustment unit in the present invention.

The AD converter 1 is a one-bit resolution AD converter which converts the input analog signal into the digital signal with the single comparator 10. Therefore, the AD converter 1 is to obtain information on a waveform of the input analog signal not from a multi-bit digital signal but from a frequency of appearance of an output code "1" or "0". When the determination voltage to be input to the comparator 10 is changed, the frequency of appearance of the output code "1" or "0" changes in accordance with the change. For this reason, when the level of the determination voltage is freely set by the DC voltage adjustment unit 12, various types of information on the waveform of the input analog signal can be grasped from the frequency of appearance of the output code "1" or "0".

The digital signal output from the encoder 11 is input to a processing unit 13. The processing unit 13 calculates the frequency of appearance of the code "1" or "0" of the digital signal input within a predetermined time, and outputs a result of the calculation to a control unit 14. That is, the calculation result represents the frequency of appearance of the output code "1" or "0" described above. The control unit 14 controls, in accordance with input from a user, the DC voltage adjustment unit 12 to change the determination voltage to be input to the comparator 10 so that the calculation result sent from the processing unit 13 becomes a predetermined value.

It is only required that the processing unit be able to grasp the frequency of appearance of the output code of the encoder by counting the output code, and the processing unit can be formed of a counter, for example. Further, the processing unit may be formed of a field programmable gate array (FPGA), and other processing such as frequency analysis processing may be simultaneously executed on the digital signal output from the encoder.

Now, assuming that the maximum allowable input voltage of the AD converter 1 is represented by $V_{top}$, the minimum allowable input voltage thereof is represented by $V_{btm}$, the determination voltage is represented by $V_d$, the input voltage of the analog signal input to the comparator 10 is represented by $V_i$, the output code is "1" when the input voltage $V_i$ is higher than the determination voltage $V_d$ ($V_i > V_d$), and the output code is "0" when the input voltage $V_i$ is lower than the determination voltage $V_d$ ($V_i < V_d$), a relationship between the determination voltage and the frequency of appearance of the code of the digital signal is described.

(1) When the determination voltage $V_d$ is approximately equal to $V_{btm}$ and all of the output codes are "1", it can be grasped that the input voltage of the analog signal is not lower than the minimum allowable input voltage of the AD converter. Meanwhile, when the output code "0" occurs, it can be grasped that the input voltage of the analog signal is sometimes lower than the minimum allowable input voltage. Therefore, the control unit 14 can issue a warning of too small input by checking the calculation result obtained by the processing unit 13.

(2) When the determination voltage $V_d$ is approximately equal to $V_{top}$ and all of the output codes are "0", it can be grasped that the input voltage of the analog signal is not higher than the maximum allowable input voltage of the AD converter. Meanwhile, when the output code "1" occurs, it can be grasped that the input voltage of the analog signal is sometimes higher than the maximum allowable input voltage. Therefore, the control unit 14 can issue a warning of too large input by checking the calculation result obtained by the processing unit 13.

Further, when the user instructs the control unit 14 to search for a maximum value or a minimum value of the input voltage of the analog signal, the control unit 14 can find out the determination voltage at which all of the output codes of the digital signal are "1" or "0" by changing the determination voltage. That is, it can be inferred that, when all of the output codes are "1", the determination voltage at this time is the minimum value of the input voltage of the analog signal, and when all of the output codes are "0", the determination voltage at this time is the maximum value of the input voltage of the analog signal.

(3) When the determination voltage $V_d$ is set to 0 V and a ratio of appearance of the output code "1" or "0" is not 50%, it can be determined that the input analog signal includes a DC component. Moreover, by changing the determination voltage $V_d$, it is possible to find out $V_d$ at which the ratio of appearance of the output code "1" or "0" is 50%, and $V_d$ at this time equals the DC component included in the input analog signal. Therefore, when $V_d$ that has been found out, that is, the DC component of the input analog signal exceeds an allowable range of a semiconductor device to which the signal is to be applied, the control unit 14 can issue a warning of too large input based on the calculation result obtained by the processing unit 13.

(4) When there is periodicity in the appearance of the output code "1" or "0", it can be grasped that the input analog signal is a signal having periodicity. The frequency of the input analog signal can be known from the periodicity, and frequency components of the input analog signal can be known by applying frequency analysis processing such as fast Fourier transform to time-series data of the output code. Further, by changing the determination voltage $V_d$ and examining the ratio of appearance of the output code "1" or "0", it is possible to grasp information on the waveform of the input analog signal (e.g., sine wave, triangle wave, and pulse waveform). In addition, when the grasped waveform of the input analog signal is sinusoidal, it is also possible to measure harmonic distortion caused by nonlinearities in devices, such as the AD converter and an amplifier.

(5) When there is no regularity in the appearance of the output code "1" or "0" and the input analog signal is a noise signal, it is possible to measure the power of the noise signal from the frequency of appearance of the output code. This point is described in detail in an embodiment of the power measurement device for wideband noise described later.

As described above, although the AD converter of the present invention has a one-bit resolution, it is possible to search for various types of information on the waveform of the input analog signal by freely changing the determination voltage to be input to the comparator 10 in accordance with the calculation result obtained by the processing unit. In addition, the AD converter can operate at a much higher speed than a multi-bit AD converter, and with its small circuit size, it is also possible to suppress its power consumption.

Therefore, the AD converter of the present invention can be used for the power measurement device and the power spectrum measurement device for a noise signal over a wide band of several 10 GHz or more, and the AD converter is particularly optimal for a measurement device to be used under an environment in which downsizing and low power consumption are strictly required, such as a measurement device to be mounted on a spacecraft such as an artificial satellite. Further, the AD converter is effective for collecting various types of information on unknown noise signals under such an environment.

In the embodiment described with reference to FIG. 1, the determination voltage is shifted in accordance with the frequency of appearance of the code "1" or "0" of the digital signal calculated by the processing unit 13, and various types of information on the waveform of the input analog signal are searched for based on the shift. However, even when the determination voltage is fixed and the adjustment unit in the present invention shifts the input voltage of the analog signal to be input to the comparator, it is possible to search for various types of information on the waveform of the input analog signal in a similar manner.

Next, the power measurement device for wideband noise using the AD converter of the present invention is described.

It is known that the distribution of amplitude values of wideband noise signals emitted from nature follows a normal distribution, and noise that follows such a normal distribution is referred to as "Gaussian noise." An effective value of the Gaussian noise corresponds to a standard deviation of a normal distribution, and hence it is possible to know the power of the noise when a voltage corresponding to the standard deviation of the input noise signal can be known.

In general, in order to know the standard deviation of an input noise signal, a large number of amplitude values of the noise signal are sampled, and the standard deviation is calculated from the distribution of those amplitude values. The standard deviation can also be obtained by calculating the frequency of appearance of a specific amplitude value from a large number of samples of amplitude values, but a multi-bit AD converter is required in order to measure the frequency of appearance of a specific amplitude value.

Meanwhile, in a normal distribution, a probability that, when a specific variable value is set as a threshold value, a variable value is equal to or less than the value is known as a cumulative distribution function. When the standard deviation is represented by $\sigma$ and an average value of a large number of samples is 0, the cumulative distribution function of a normal distribution is shown by the following equation.

$$\Phi(x) = \frac{1}{2}\left\{1 + \text{erf}\left(\frac{x}{\sqrt{2}\sigma}\right)\right\}$$

As shown in this equation, when a specific variable that is the threshold value is represented by "x", a frequency $\Phi(x)$ of amplitude values being lower than the threshold value "x" is a function that includes the standard deviation $\sigma$, and when the value of @ can be grasped, the standard deviation σ can be obtained. For this reason, through use of a specific amplitude value as the threshold value and through application of a frequency of appearance of an amplitude that is the threshold value or smaller, or the threshold value or larger, to the cumulative distribution function given above, the standard deviation of the input noise signal can be known, and the power of the noise signal can be grasped from the obtained standard deviation.

It should be noted, however, that the specific amplitude value to be used as the threshold value is required to be offset with respect to the average value of the amplitude of the noise signal. The Gaussian noise follows a normal distribution, and hence, irrespective of the value of the standard deviation, the value of the cumulative distribution function is 50% at the average value of the amplitude in the Gaussian noise. For this reason, when the average value of the amplitude is used as the threshold value in the one-bit AD converter, information on the amplitude of the noise signal is lost, and it is thus impossible to measure the power of the noise signal.

Figure 2:
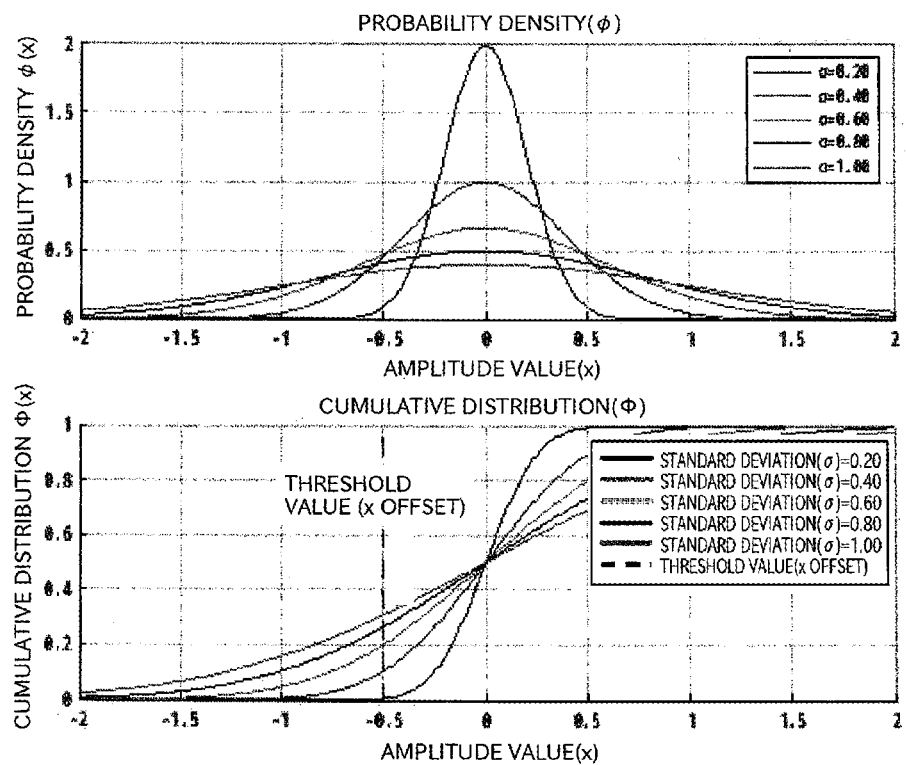
FIG. 2 shows graphs for showing a relationship between an amplitude value "x" of a noise signal and a probability density function φ (x) and a relationship between the amplitude value "x" of the noise signal and a cumulative distribution function Φ (x).
Figure 3:
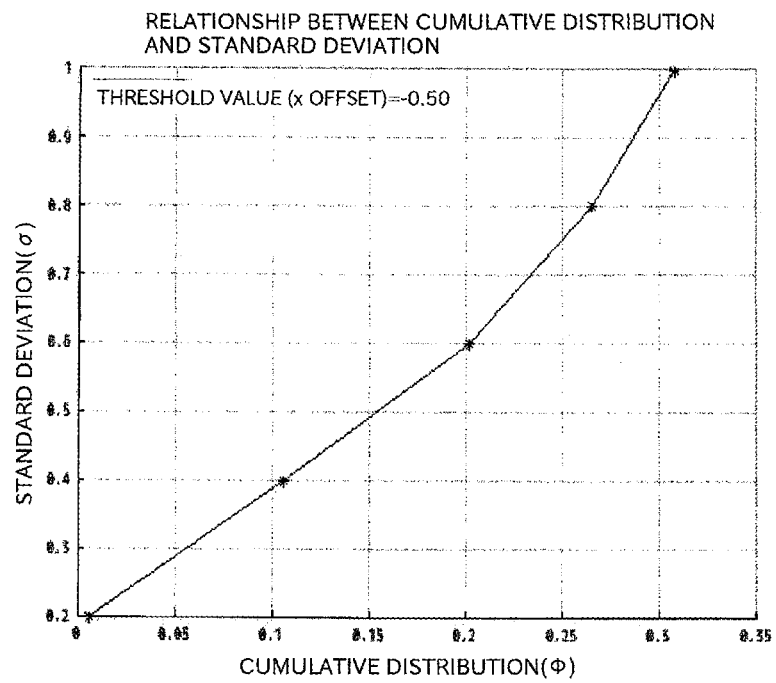
FIG. 3 is a graph for showing a relationship between a value Φ of the cumulative distribution function and a standard deviation σ in a case in which a threshold value is set to −0.5 in FIG. 2.

FIG. 2 shows graphs for showing, for each of different noise signals having standard deviations σ of 0.2, 0.4, 0.6, 0.8, and 1.0, a relationship between the amplitude value "x" of the noise signal and the probability density function φ (x) and a relationship between the amplitude value "x" of the noise signal and the cumulative distribution function Φ (x). Further, FIG. 3 shows a relationship between the value Φ of the cumulative distribution function and the standard deviation σ in a case in which the threshold value is set to −0.5 in FIG. 2.

From the relationships, by measuring the frequency of appearance of samples having the amplitude value that is the threshold value or smaller, or the threshold value or larger, from a large number of samples of the amplitude values of the noise signals, it is possible to derive the standard deviation σ of the input noise signal, and thus the power value of the noise signal.

Figure 4:
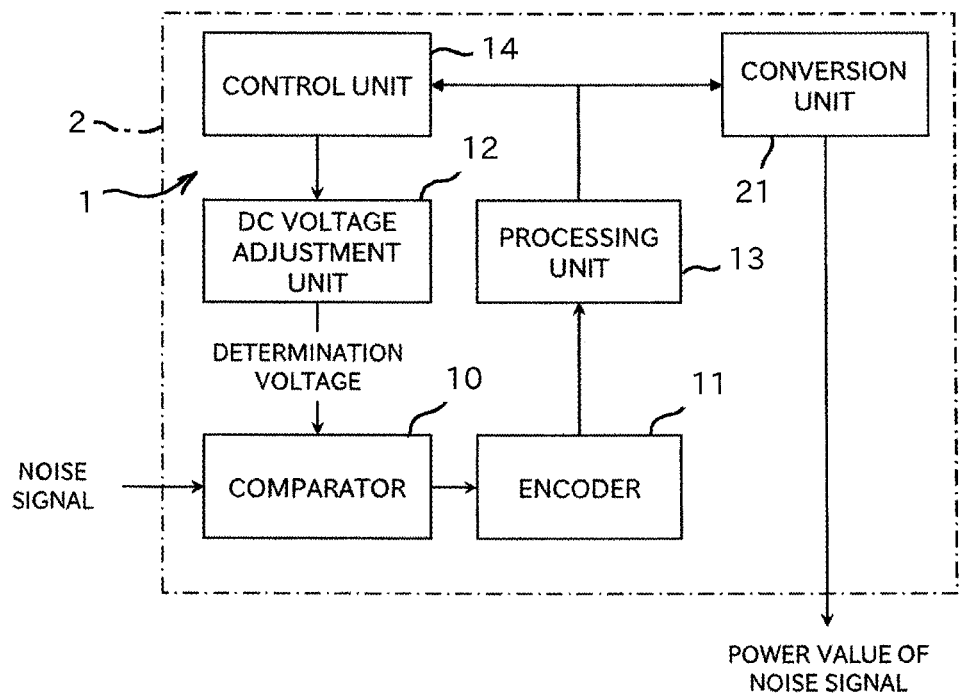
FIG. 4 is a block diagram for illustrating an example of a configuration of a power measurement device using the AD converter of the present invention.

FIG. 4 is a block diagram for illustrating one embodiment of the power measurement device for wideband noise which is formed through use of the AD converter of the present invention.

The power measurement device 2 of this embodiment uses the one-bit resolution AD converter 1 illustrated in FIG. 1, and includes a conversion unit 21 which outputs the power value of the input noise signal. The conversion unit 21 derives the power value of the input noise signal through use of the calculation result of the frequency of appearance of the output code "1" or "0" output from the processing unit 13 of the AD converter 1 and the determination voltage corresponding to the threshold value. A detailed description of the components of the AD converter 1 is omitted by assigning the same reference numerals as those of FIG. 1 in FIG. 4.

The comparator 10 of the AD converter 1 compares the input noise signal (analog signal) to the determination voltage, and the encoder 11 outputs a code having a logical level "1" or "0" depending on whether the amplitude of the noise signal is larger than the determination voltage or smaller than the determination voltage. The determination voltage to be used in this case is a threshold value that is offset with respect to the average value of the amplitude of the noise signal, and can be set freely within an allowable input voltage range of the comparator 10. Thus, the optimal voltage value can be selected in accordance with the range of the amplitude of the noise signal to be input. Moreover, even when the noise signal to be input to the comparator 10 is unknown, the average value of the amplitude of the noise signal can be grasped by searching for the determination voltage at which the frequency of appearance of the code "1" or "0" of the digital signal is 50% as described above.

The processing unit 13 calculates the frequency of appearance of the code "1" or "0" output from the encoder 11 at regular intervals. With this calculation, it is possible to obtain the calculation result (frequency of appearance) that the amplitude value of the noise signal input to the AD converter 1 is the determination voltage or smaller, or the determination voltage or larger. It is possible to derive the standard deviation σ of the input noise signal, and thus the power value of the noise signal, by applying the value of the frequency of appearance thus acquired and the determination voltage corresponding to the threshold value to the cumulative distribution function in the conversion unit 21.

As described above, the power measurement device for wideband noise described in this embodiment can easily be implemented by calculating the frequency of appearance of the output code of the one-bit digital signal output from the AD converter 1 illustrated in FIG. 1. Moreover, when the processing unit 13 is formed of a counter, the comparator 10, the encoder 11, and the processing unit 13 which form the AD converter 1 can operate at a much higher speed than a multi-bit AD converter and a multi-bit arithmetic unit. The power measurement device also has an advantage of low power consumption due to its small circuit size.

Therefore, the power measurement device using the AD converter of the present invention can measure the power of a wideband noise signal of several 10 GHz or more, and when the bandwidth of the noise signal to be measured is similar, the measurement can be performed on a smaller scale and with lower power consumption than with a multi-bit AD converter. This makes it possible to implement the power measurement device even under an environment in which downsizing and low power consumption thereof are strictly required, and also makes it easier to mount the power measurement device on a spacecraft such as an artificial satellite.

Further, it is possible to collect various types of information, such as the average value, the maximum value, and the minimum value, on an unknown noise signal while freely changing the determination voltage, and to measure the power of the noise signal in conjunction with the collection of information. Also in this regard, the power measurement device is optimal for being mounted on a spacecraft such as an artificial satellite.

Still further, in the related-art multi-bit flash AD converter, the reference voltage is divided in accordance with the resolution to generate the threshold voltage to be applied to each comparator, and the threshold voltage is then compared to the input analog signal. Thus, when each divided threshold voltage includes an error, a change level of a multi-bit digital signal generated by piling up comparison results obtained by a plurality of comparators may not correctly reflect a change level of the input analog signal.

In this regard, with the power measurement device using the AD converter of the present invention, it is possible to calibrate the device by inputting an analog signal with a known change in power value to the power measurement device of this embodiment and adjusting the determination voltage to be input to the AD converter so that a change in measured power value matches a change in input power value. For this reason, by performing such calibration in advance, the power measurement device of this embodiment can correctly reflect the change level of the input analog signal in the digital signal to guarantee the measurement accuracy of this power measurement device.

In the embodiment described with reference to FIG. 4, the AD converter described specifically with reference to FIG. 1 is used, but the determination voltage may be fixed and the average voltage of the noise signal to be input to the comparator may be shifted. Even with such a configuration, it is possible to derive the standard deviation σ of the input noise signal, and thus the power value of the noise signal, by calculating the frequency of appearance of the code "1" or "0" output from the encoder 11 at regular intervals.

Next, the power spectrum measurement device for wideband noise using the AD converter of the present invention is described.

As a method of measuring a power spectrum of a noise signal, the following method is publicly known. Specifically, a noise signal corresponding to an analog signal is input to a one-bit resolution AD converter, and the noise signal is sampled at a predetermined frequency to be digitized. Then, time-series data thus obtained is subjected to Fourier transform to acquire the power spectrum of the noise signal by dividing the power spectrum by a fixed frequency band.

As a document mentioning this power spectrum measurement method, for example, A DIGITAL SPECTRAL ANALYSIS TECHNIQUE AND ITS APPLICATION TO RADIO ASTRONOMY, MASSACHUSETTS INSTITUTE OF TECHNOLOGY RESEARCH LABORATORY OF ELECTRONICS, Technical Report 412, Aug. 30, 1963 is known.

The method proposed in this document enables power spectrum measurement without large errors even when the resolution of the AD converter is one bit, and is suitable for downsizing and low power consumption of the device. For this reason, a power spectrum measurement method using a one-bit resolution AD converter is already in practical use in fields such as radio astronomy.

However, the one-bit resolution AD converter used in such a publicly known power spectrum measurement method sets a threshold voltage for quantizing an analog signal to an average value of an input noise signal, and hence amplitude information of the noise signal is lost. For this reason, although it is possible to determine a relative magnitude relationship of power values in each frequency band, it is difficult to grasp the magnitudes of the power values.

Figure 5:
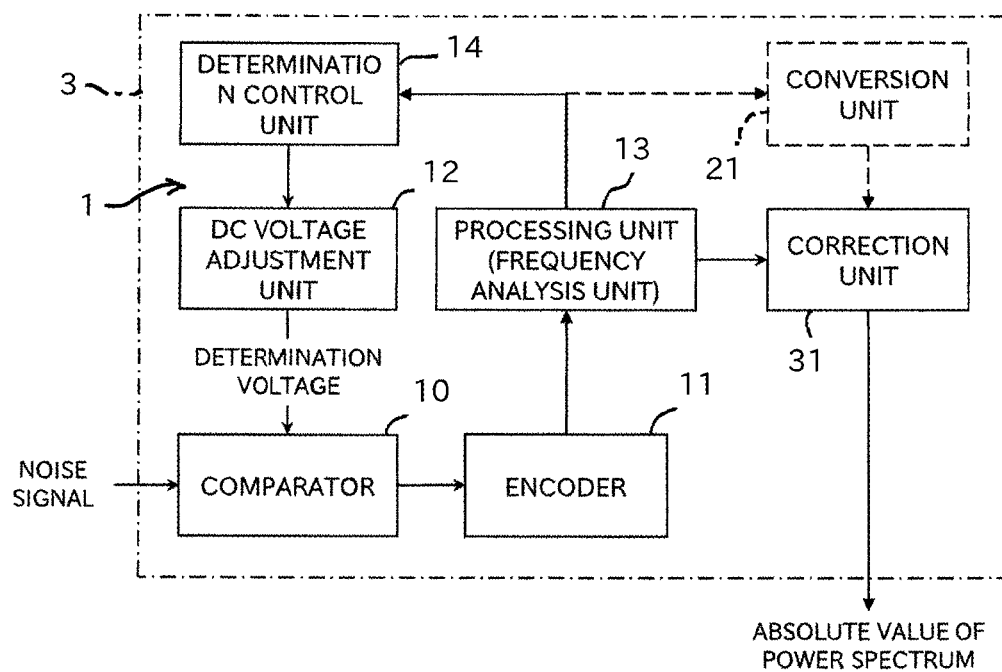
FIG. 5 is a block diagram for illustrating an example of a configuration of a power spectrum measurement device using the AD converter of the present invention.

FIG. 5 shows one embodiment of a power spectrum measurement device 3 using the AD converter 1 illustrated in FIG. 1, and the power spectrum measurement device 3 can measure the magnitude of the power spectrum in each frequency band included in the wideband noise signal.

As illustrated in the figure, the power spectrum measurement device 3 of this embodiment has the configuration of the AD converter 1 described with reference to FIG. 1. In this embodiment, the processing unit of the AD converter 1 is formed of an FPGA, and calculates the frequency of appearance of the output code of the one-bit digital signal output from the encoder, and further, decomposes the digital signal into its constituent frequency components to acquire a power spectrum. That is, programs for frequency analysis processing, such as fast Fourier transform, cosine transform, and discrete Fourier transform, are implemented in the FPGA. A detailed description of the components of the AD converter 1 is omitted by assigning the same reference numerals as those of FIG. 1 in FIG. 5.

The comparator 10 of the AD converter 1 compares the input noise signal (analog signal) to the determination voltage, and the encoder 11 outputs the code having a logical level "1" or "0" depending on whether the amplitude of the noise signal is larger than the determination voltage or smaller than the determination voltage. The determination voltage to be used in this case is a threshold value that is offset with respect to the average value of the amplitude of the noise signal, and can be set freely within the allowable input voltage range of the comparator 10. Thus, the optimal voltage value can be selected in accordance with the range of the amplitude of the noise signal to be input.

The time-series data of the code "1" or "0" output from the encoder is input to the processing unit 13 to be subjected to Fourier transform, and thus the power spectrum of each fixed frequency band can be obtained. Offsetting of the determination voltage with respect to the average value of the amplitude of the input noise signal only changes the DC component in the frequency domain, but does not affect the spectral component of each frequency band. Therefore, it is possible to measure the power spectrum of the input noise signal even when a one-bit digital signal is generated through use of the AD converter of the present invention illustrated in FIG. 1.

It should be noted, however, that the information on the power spectrum obtained by the processing unit indicates only the relative magnitude relationship of the power values in each frequency band, and the magnitudes themselves of the power values in each frequency band are unknown.

Meanwhile, the processing unit calculates the frequency of appearance of the code "1" or "0" output from the encoder 11 at regular intervals, and in the same manner as in the power measurement device illustrated in FIG. 4, it is possible to derive the power value of the input noise signal by applying the results of the calculation and the determination voltage to the cumulative distribution function in the conversion unit 21. The DC component in the frequency domain indicates the number of times of appearance of the code "1" output from the encoder, and hence, when the digital signal is decomposed into its constituent frequency components in the processing unit as described in this embodiment, it is not required to provide a counter which counts the codes included in the digital signal to the processing unit.

The power spectrum obtained by processing unit 13 is input to a correction unit 31 provided in the subsequent stage of the processing unit 13. The correction unit 31 corrects the information on the power spectrum input from the processing unit 13 through use of the sum of the power values of the input noise signal derived by the conversion unit 21 to obtain an absolute value of the power spectrum in each frequency band.

The conversion unit 21 and the correction unit 31 can be implemented in the same FPGA as that of the processing unit.

With this configuration, it is possible to measure the magnitude of the power spectrum for the frequency components included in the wideband noise signal. Further, such power spectrum measurement can be implemented through use of only the one-bit resolution AD converter. That is, it is possible to implement the power spectrum measurement device described in this embodiment even under an environment in which downsizing and low power consumption are strictly required, and it becomes easier to mount the power spectrum measurement device on a spacecraft such as an artificial satellite.

In the embodiment described with reference to FIG. 5, the AD converter described specifically with reference to FIG. 1 is used, but the determination voltage may be fixed and the average voltage of the noise signal to be input to the comparator may be shifted. Even with such a configuration, it is possible to derive the frequency of appearance of the code "1" or "0" output from the encoder 11 and the power value of the input noise signal, and it is consequently possible to obtain the absolute value of the power spectrum in each frequency band.

As described above, through use of the AD converter of the present invention, it is possible to obtain various types of information on the waveform of the input analog signal, in particular, various types of information on the waveform of unknown noise signals emitted from nature and deep space, from the frequency of appearance of the code of the 1-bit digital signal. Moreover, the AD converter can be implemented with a small circuit configuration and low power consumption, and hence the AD converter can convert a wideband noise signal of several GHz or more into a digital signal for processing, and is optimal for various measurement devices with significant limitations in installation space and power supply, in particular, a measurement device to be mounted on a spacecraft such as an artificial satellite. Further, the AD converter is effective for collecting various types of information on unknown noise signals under such an environment.

The invention claimed is:

1. A power measurement device for a wideband noise signal, for measuring power of a noise signal emitted by an object to be measured, the power measurement device comprising:
    a comparator configured to compare an input voltage of an analog signal corresponding to the noise signal that has been measured to a determination voltage;
    an adjustment unit configured to shift at least one of the input voltage of the analog signal or the determination voltage;
    an encoder configured to output time-series data of one bit based on a result of the comparison obtained by the comparator;
    a processing unit configured to calculate a frequency of appearance of an output code included in the time-series data;
    a control unit configured to cause the adjustment unit to operate so that the determination voltage is offset with respect to an average voltage of the noise signal; and
    a conversion unit configured to apply the frequency of appearance calculated by the processing unit and the determination voltage to a cumulative distribution function to obtain a standard deviation corresponding to a power value of the noise signal that has been input.

2. The power measurement device for a wideband noise signal according to claim 1, wherein the adjustment unit is configured to freely shift the determination voltage between a maximum allowable input voltage and a minimum allowable input voltage of the comparator.

3. The power measurement device for a wideband noise signal according to claim 1, wherein the adjustment unit is configured to freely shift the average voltage of the noise signal.

4. A power spectrum measurement device for a wideband noise signal, for measuring a power spectrum of a noise signal emitted by an object to be measured, the power spectrum measurement device comprising:
    a comparator configured to compare an input voltage of an analog signal corresponding to the noise signal that has been measured to a determination voltage;
    an adjustment unit configured to shift at least one of the input voltage of the analog signal or the determination voltage;
    an encoder configured to output time-series data of one bit based on a result of the comparison obtained by the comparator;
    a processing unit configured to calculate a frequency of appearance of an output code included in the time-series data; and
    a control unit configured to cause the adjustment unit to operate so that the determination voltage is offset with respect to an average voltage of the noise signal,
    wherein the processing unit is configured to decompose the time-series data output from the encoder into constituent frequency components to acquire a power spectrum and to calculate the frequency of appearance of the output code included in the time-series data.

5. The power spectrum measurement device for a wideband noise signal according to claim 4, further comprising:
    a conversion unit configured to apply the frequency of appearance calculated by the processing unit and the determination voltage to a cumulative distribution function to obtain a standard deviation corresponding to a power value of the noise signal that has been input; and
    a correction unit configured to correct the power spectrum acquired from the processing unit through use of the power value of the noise signal acquired from the conversion unit to output an absolute value of the power spectrum in each frequency band.

* * * * *